United States Patent
Blish, II et al.

[11] Patent Number: 6,049,465
[45] Date of Patent: Apr. 11, 2000

[54] SIGNAL CARRYING MEANS INCLUDING A CARRIER SUBSTRATE AND WIRE BONDS FOR CARRYING SIGNALS BETWEEN THE CACHE AND LOGIC CIRCUITRY OF A MICROPROCESSOR

[75] Inventors: Richard C. Blish, II, Saratoga; Colin Hatchard, Campbell; David Edward Lewis, Sunnyvale, all of Calif.

[73] Assignee: Advanced Micro Devices, Inc., Sunnyvale, Calif.

[21] Appl. No.: 09/160,830

[22] Filed: Sep. 25, 1998

[51] Int. Cl.[7] ...................................................... H05K 7/02
[52] U.S. Cl. .......................... 361/767; 361/764; 361/782; 361/803; 257/723; 257/724; 257/784; 365/51; 365/63
[58] Field of Search ..................................... 361/734, 736, 361/748, 760, 761, 763, 764, 767, 768, 784, 803, 782; 257/686, 697, 700, 723, 724, 728, 730, 737, 738, 777, 778, 784, 786; 365/51, 52, 63, 72; 711/118–122, 125, 126; 174/52.1, 52.2, 52.3, 52.4, 260

[56] References Cited

U.S. PATENT DOCUMENTS

| 4,695,872 | 9/1987 | Chatterjee | 257/723 |
| 5,068,631 | 11/1991 | Vince | 333/181 |
| 5,287,247 | 2/1994 | Smits et al. | 361/761 |
| 5,391,917 | 2/1995 | Gilmour et al. | 257/724 |
| 5,678,020 | 10/1997 | Singh et al. | 711/100 |
| 5,786,628 | 7/1998 | Beilstein, Jr. et al. | 257/686 |
| 5,790,384 | 8/1998 | Ahmad et al. | 361/760 |
| 5,793,101 | 8/1998 | Kuhn | 257/676 |
| 5,793,115 | 8/1998 | Zavracky et al. | 257/777 |
| 5,856,937 | 1/1999 | Chu et al. | 365/51 |
| 5,867,419 | 2/1999 | Chengson et al. | 365/63 |
| 5,869,895 | 2/1999 | Raad | 257/723 |

*Primary Examiner*—Donald Sparks
*Assistant Examiner*—John B. Vigushin
*Attorney, Agent, or Firm*—Sawyer & Associates

[57] ABSTRACT

The present invention provides a microprocessor, the microprocessor having a substrate with a first and a second side, the first and second sides being on opposite sides of the substrate. The microprocessor includes decoupling capacitors on the first side of the substrate; cache circuitry on the first side of the substrate; logic circuitry on the second side of the substrate; and a signal carrying means including a carrier substrate and wire bonds for carrying signals between the logic and cache circuitry.

4 Claims, 5 Drawing Sheets

SIGNAL CARRYING MEANS INCLUDING A CARRIER SUBSTRATE AND WIRE BONDS FOR CARRYING SIGNALS BETWEEN THE CACHE AND LOGIC CIRCUITRY OF A MICROPROCESSOR

FIELD OF THE INVENTION

The present invention relates to microprocessors, and more particularly to the yield and functionality of microprocessors.

BACKGROUND OF THE INVENTION

In an attempt to increase the performance of microprocessors with Static Random Access Memory (SRAM), many in the industry has developed microprocessors where the logic circuitry of the processor and the cache circuitry are placed in close proximity on the same substrate. The logic and cache circuitry are thus coupled.

FIG. 1 illustrates a cross section of a conventional microprocessor in which the logic and cache circuitry are placed on the same side of a substrate. The microprocessor 100 includes a substrate 110 on which contains the logic and cache circuitry 120 on one side of the substrate 110. On that same side, controlled collapsed chip connections 130 (commonly referred to as "C4"), encased in under fill, are attached between the substrate 110 and the substrate 140. The C4 facilitates the connections between the substrate 110 and one side of the substrate 140. C4 is well known in the art and will not be further described here. Heat generated by the circuitry on the substrate 110 is carried away in the opposite direction of the signal flow, from the logic and cache circuitry 120 to the pins, lands or balls. On the other side of the substrate 140, are pins 150, balls 160, and lands 170. The pins 150 attach the microprocessor 100 to a printed circuit board (not shown). Alternatively the balls 160 connect the microprocessor to printed circuit board. The lands 170 are landing pads which rests the microprocessor 100 upon the printed circuit board.

FIG. 2 illustrates a top view of the substrate 110 of the microprocessor 100. The logic and cache circuitry 120, are placed together in the center of the substrate 110. Decoupling capacitors 210 surround the circuitry to provide load energy/storage so that the electromagnetic fields created by the signals from the circuitry do not result in a draining of the distant power supply (not shown). The use of decoupling capacitors 210 are well known in the art and will not be further discussed here.

The coupling of the logic and cache circuitry 120 in the conventional microprocessor 100 allows recently used data or instructions in the cache to be readily available to the processor, instead of requiring the processor to search for the data or instructions as in the case where distant, slow Dynamic Random Access Memory (DRAM) is used. However, due to the coupling of the logic and cache circuitry 120, the "yield" of the substrate 110 is significantly reduced. What is meant by "yield" in the context of the present application is the total number of substrates that are viable on a wafer after the manufacturing process. As is well known in the art, the yield decreases exponentially as the area of the substrate increases if defect density is constant. In the microprocessor 100, since the logic and cache circuitry 120 are placed on the same side of the substrate, the required area of substrate 100 is larger as the logic and cache circuitry becomes larger. Thus, the yield for the microprocessor 100 suffers as the size of the logic and cache circuitry increases. Accordingly, the yield reliability and cost of the microprocessor 100 is adversely impacted.

Accordingly, there exists a need for a microprocessor which has the logic and cache circuitry in close proximity on the same substrate but which has a larger yield than conventional microprocessors. The present invention addresses such a need.

SUMMARY OF THE INVENTION

The present invention provides a microprocessor, the microprocessor having a substrate with a first and a second side, the first and second sides being on opposite sides of the substrate. The microprocessor includes decoupling capacitors on the first side of the substrate; cache circuitry on the first side of the substrate; logic circuitry on the second side of the substrate; and a mechanism for carrying signals between the logic and cache circuitry.

DETAILED DESCRIPTION

The present invention provides a microprocessor which provides for an improved yield over conventional microprocessors. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

The present invention provides a microprocessor which decouples the logic and cache circuitry while still maintaining them in close proximity on the same substrate. To more particularly describe the features of the present invention, please refer to FIGS. 3 through 5 in conjunction with the discussion below.

Figure 1:
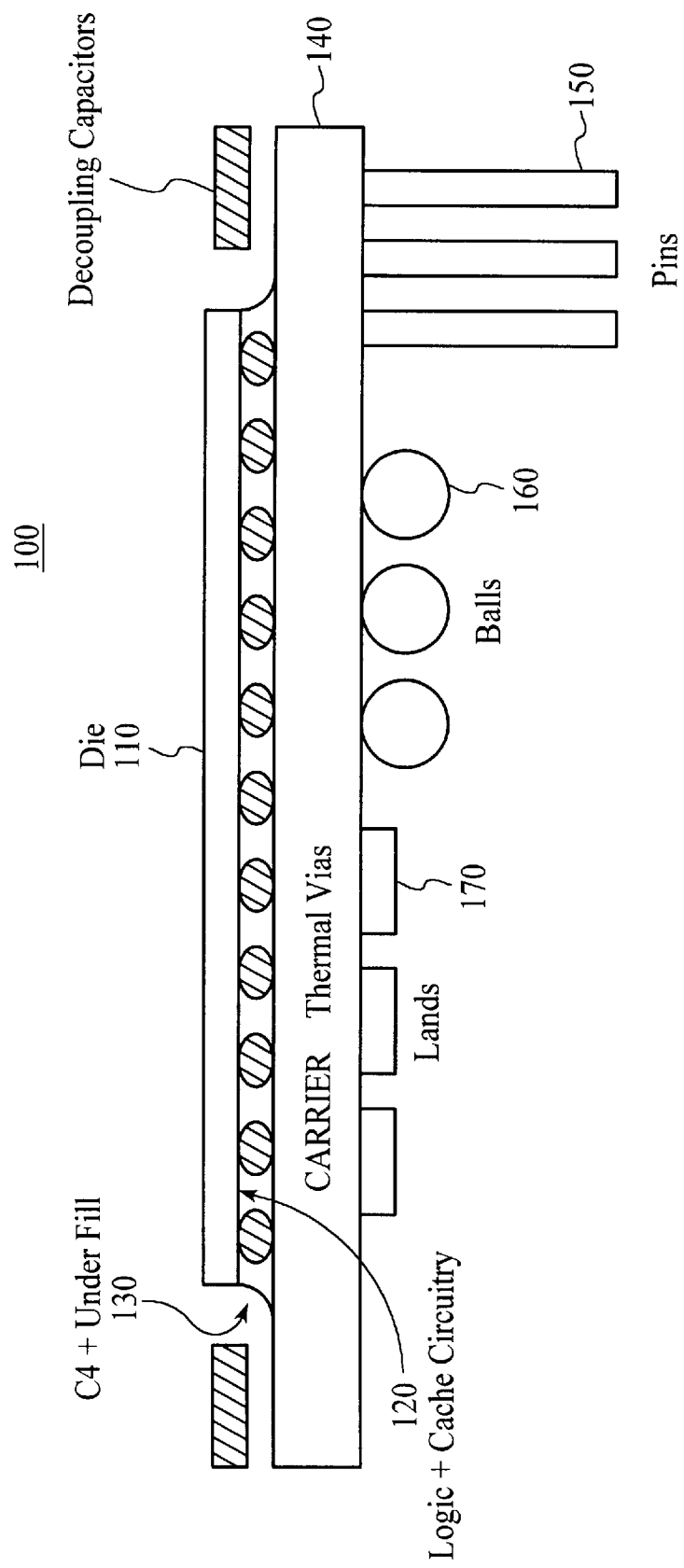
FIG. 1 illustrates a cross section of a conventional microprocessor.
Figure 2:
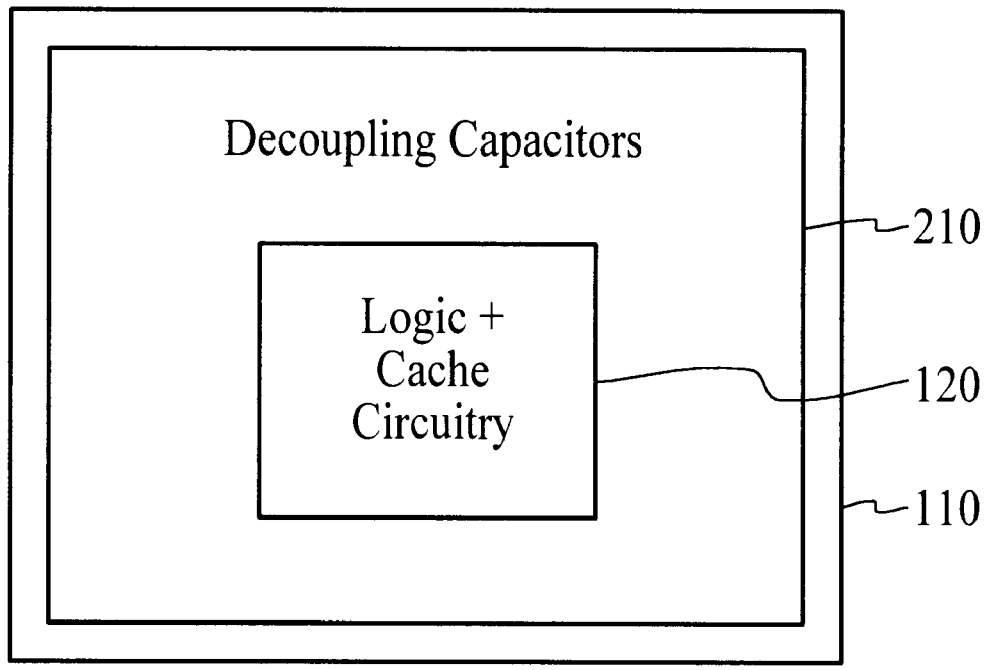
FIG. 2 illustrates a top view of the substrate of the conventional microprocessor.
Figure 3:
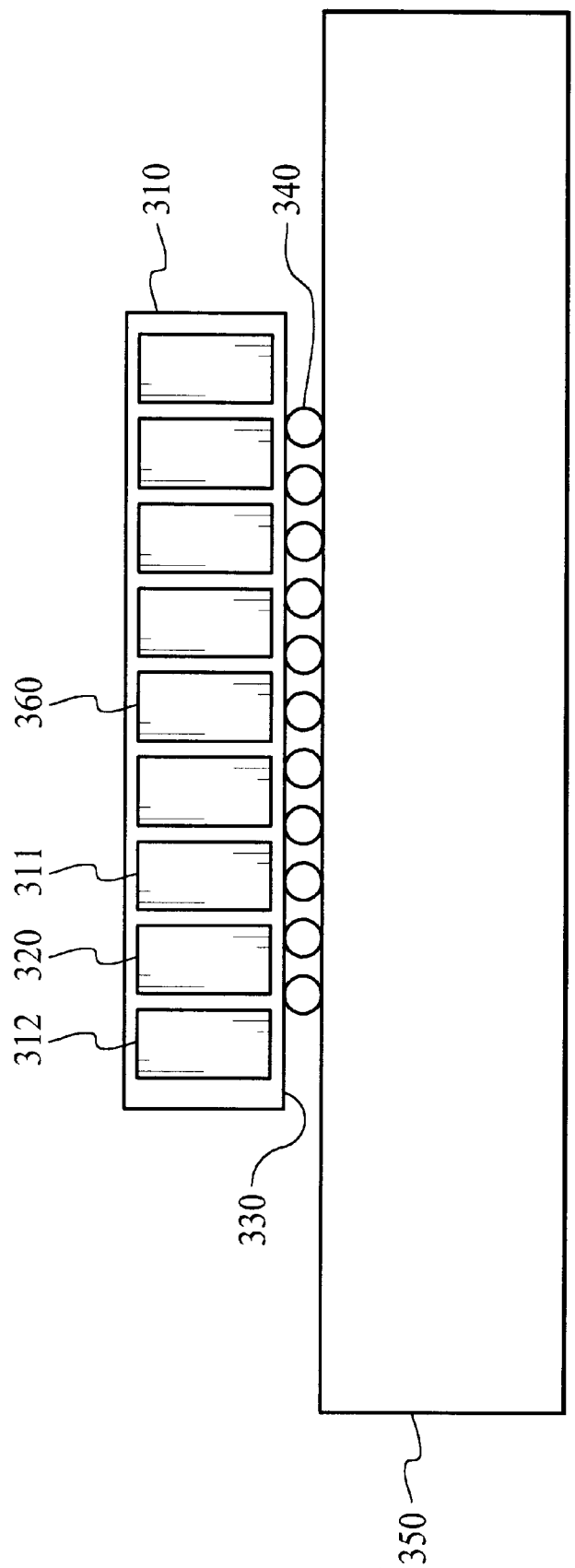
FIG. 3 illustrates a microprocessor in accordance with the present invention.

FIG. 3 is an illustration of a cross section of a microprocessor 300 in accordance with the present invention. The microprocessor 300 includes a substrate 310. The cache circuitry 320 is coupled to a first side 311 of the substrate 310. The logic circuitry 330 is coupled to the opposite side 312 of the substrate 310. Signals from the cache circuitry 320 are routed to the substrate 350 through some type of signal carrier (not shown). The signal carrier will be shown in more detail in FIG. 4. This signal carrier carries the signals to the interconnects in the substrate 350, which then route them to the appropriate locations in the logic circuitry 330 to be processed. Signals from the logic circuitry 330 are routed to the cache circuitry 320 through the same signal carrier. The controlled collapsed chip connections 340 (C4) are attached between the logic circuitry 330 and the substrate 350. The C4 in the microprocessor 300 of the present invention have the same function as the C4 in the conventional microprocessor 100 (FIG. 1).

In this embodiment, decoupling capacitors 360 are provided on side 311 of the substrate 310. However, one of ordinary skill in the art will understand that they may be located on either side of the substrate 310 without departing from the spirit and scope of the present invention, as long as they are in close enough proximity to the cache and logic circuitry to provide low-inductive capacitance so that electromagnetic fields created by the signals from the circuitry do not result in a draining of the power supply (not shown).

Figure 4:
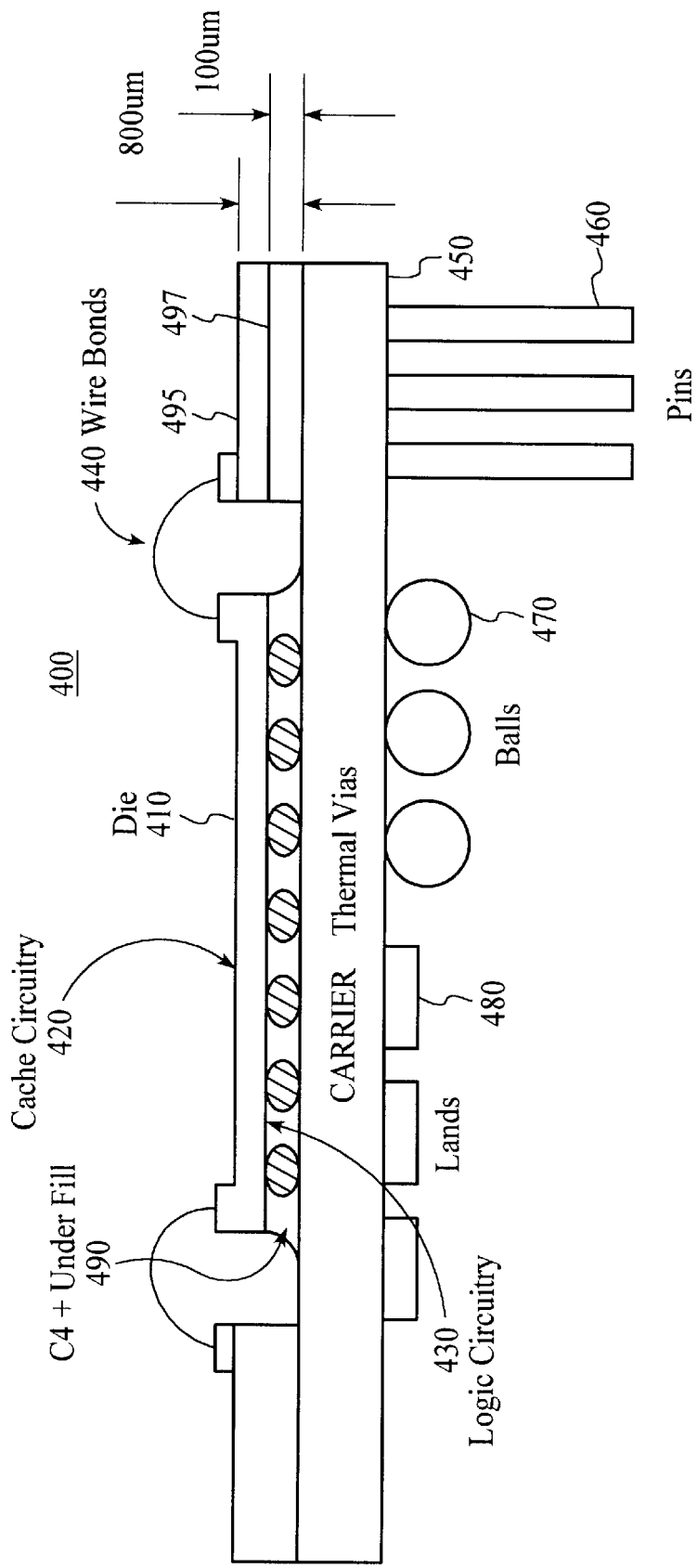
FIG. 4 illustrates a cross section of a preferred embodiment of the microprocessor in accordance with the present invention.

FIG. 4 illustrates a cross sectional view of a preferred embodiment of the microprocessor in accordance with the present invention. In this embodiment, the microprocessor 400 has a substrate 410, preferably composed of untapped silicon approximately 1 mm thick. On one side of the substrate 410 is the cache circuitry 420 which comprises Static Random Access Memories (SRAMs) and decoupling capacitors. On the opposite side 312 of the substrate 410 is the logic circuitry 430. Signals are routed between the cache and logic circuitry 420 and 430 through short wire bonds 440 which are attached to the substrate 450. To maintain a short wire bond from the substrate 410 to the substrate 450, additional layers of substrate 495 and 497, may be added around the substrate 410 as shown. The pins 460, balls, 470, lands 480, and C4 490 have the same function has those of the conventional microprocessor 100 (FIG. 1).

Heat generated by the cache and logic circuitry 420 and 430 is dissipated by drawing the heat downward through the substrate 450. From the substrate 450, staircase or stacked thermal vias (not shown) in the substrate 450 can dump the heat into a printed wiring board, a fan sink, or some other device. In the alternate, the substrate 450 may put the heat into a fan sink, heat pipe, acoustic jet, or some other device so that heat may be dissipated upward, as with the conventional microprocessor 100. PWBs, fan skins, heat pipes, and acoustic jets are well known in the art.

Figure 5:
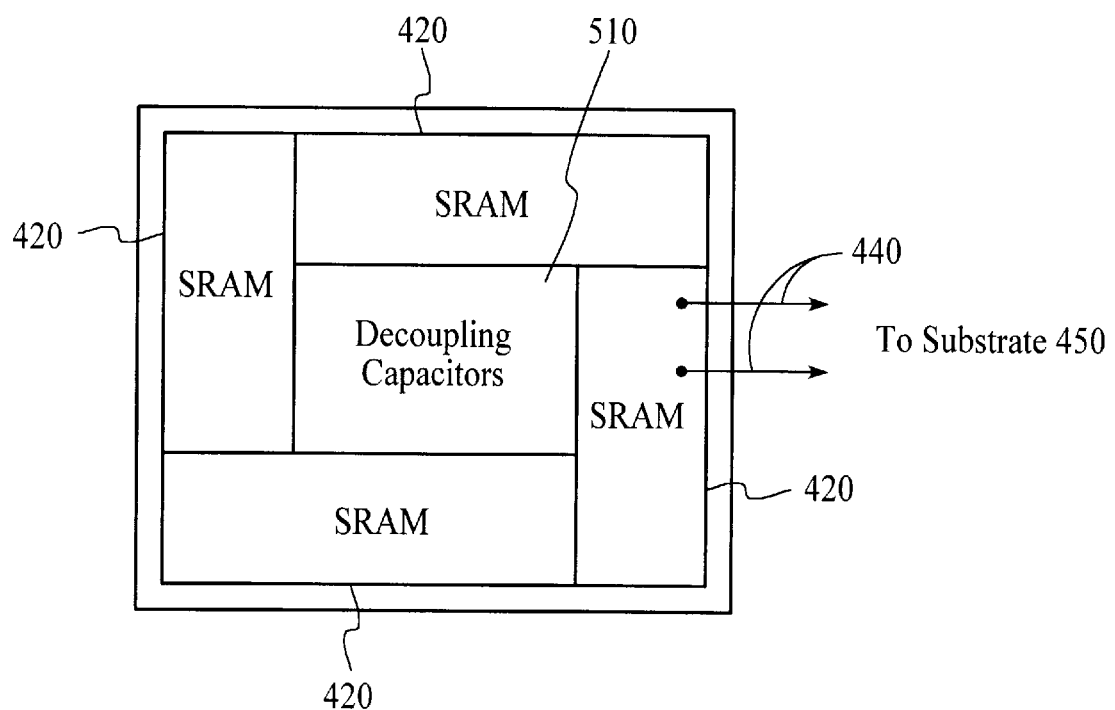
FIG. 5 illustrates a top view of the substrate of the microprocessor in accordance with the present invention

FIG. 5 illustrates a top view of the substrate 410 of the preferred embodiment of a microprocessor 400 in accordance with the present invention. The cache circuitry 420, i.e., the SRAMs, are placed around the periphery of the backside of the substrate 410. In this preferred embodiment, the cache circuitry 420 is not placed in the center of the substrate 410 as in with the conventional microprocessor 100 because at the center, there will be more clock skew and more voltage drop for signals, power, and clock pulses. Also, placing the SRAMs 420 near the edges of the substrate will decrease the required length of the wire bonds 440. By maintaining the length of the wire bonds as short as possible, the problem with inductance may be minimized. The problem with inductance (usually mitigated by multiple wires in parallel) is well known in the art and will not be further discussed here. At the center instead are the decoupling capacitors 510. An array of highly redundant wire bonds 520 carries power in and out of the decoupling capacitors. Wire bonds 440 then carry the cache circuitry signals to the substrate 450. In the preferred embodiment, an array of wire bonds is actually used, however, for the purpose of clarity of the figure, only two wire bonds are shown in FIG. 5.

Although the preferred embodiment of a microprocessor in accordance with the present invention has been described with wire bonds as signal carriers, one of ordinary skill in the art will understand that other methods of carrying signals to and from the substrate may be used without departing from the spirit and scope of the present invention. For example, holes may be bored in the substrate 450 and plugged with metal interconnects such that the cache and logic circuitry 420 and 430 are connected.

Because the cache and logic circuitry 420 and 430 are carefully selected individual elements on separate sides of the substrate 410 and thus decoupled, a smaller logic substrate may be used. With a smaller substrate, the yield penalty of the conventional microprocessor 100 is significantly reduced. With the decoupling of the cache and logic circuitry 420 and 430, there may be room on the substrate for redundant cells in the cache circuitry 420. Thus, the yield for the cache circuitry 420, and thus the substrate 410 as a whole, may be even higher. The microprocessor 300 of the present invention is thus more cost effective and reliable than conventional microprocessors.

A microprocessor with the logic and cache circuitry in close proximity on the same substrate but which has a larger yield than conventional microprocessors has been provided. The larger yield is accomplished by placing the cache circuitry on one side of the substrate while the processor circuitry is placed on the opposite side. By decoupling the cache and processor circuitry in this manner, the yield for the substrate is increased considerably, making the microprocessor more cost effective and reliable than conventional microprocessors.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A microprocessor, the microprocessor having a substrate with a first and a second side, the first and second sides being opposite sides of the substrate, comprising:

a cache circuitry on the first side of the substrate;

a logic circuitry on the second side of the substrate;

means for carrying signals between the cache circuitry and the logic circuitry, wherein the means for carrying signals comprises a plurality of wire bonds, a first portion of the wire bonds coupled between the cache circuitry and a carrier substrate, and a second portion of the wire bonds coupled between the logic circuitry and the carrier substrate, wherein the plurality of wire bonds carry signals between the cache circuitry and the logic circuitry through the carrier substrate.

2. A microprocessor, the microprocessor having a substrate with a first and a second side, the first and second sides being on opposite sides of the substrate, comprising:

a cache circuitry at the edges of the first side of the substrate;

a logic circuitry on the second side of the substrate; and a plurality of wire bonds, a first portion of the wire bonds coupled between the cache circuitry and a carrier substrate, and a second portion of the wire bonds coupled between the logic circuitry and the carrier substrate, wherein the plurality of wire bonds carry signals between the cache circuitry and the logic circuitry through the carrier substrate.

3. A microprocessor, the microprocessor having a substrate with a first and a second side, the first and second sides being on opposite sides of the substrate, comprising:

a cache circuitry at the edges of the first side of the substrate;

a logic circuitry on the second side of the substrate;

a plurality of wire bonds, a first portion of the wire bonds coupled between the cache circuitry and a carrier substrate, and a second portion of the wire bonds coupled between the logic circuitry and the carrier substrate, wherein the plurality of wire bonds carry signals between the cache circuitry and the logic circuitry through the carrier substrate; and a plurality of decoupling capacitors residing on the first or second side of the substrate.

4. A microprocessor, the microprocessor having a substrate with a first and a second side, the first and second sides being on opposite sides of the substrate, comprising:

a plurality of decoupling capacitors residing in a center of the first side of the substrate;

a cache circuitry at the edges of the first side of the substrate, wherein the cache circuitry surrounds the plurality of decoupling capacitors; and a logic circuitry on the second side of the substrate.

* * * * *